United States Patent
Bogner

(10) Patent No.: US 6,965,258 B2
(45) Date of Patent: Nov. 15, 2005

(54) SAMPLE-AND-HOLD WITH NO-DELAY RESET

(75) Inventor: Peter Bogner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/889,377

(22) Filed: Jul. 12, 2004

(65) Prior Publication Data

US 2004/0239378 A1 Dec. 2, 2004

Related U.S. Application Data

(63) Continuation of application No. PCT/DE03/01106, filed on Apr. 3, 2003.

(30) Foreign Application Priority Data

Apr. 30, 2002 (DE) ................................ 102 19 327

(51) Int. Cl.[7] .............................................. G11C 27/02
(52) U.S. Cl. ........................................ 327/94; 327/93
(58) Field of Search ............................. 327/91, 93–96, 327/337, 382, 554; 341/122–124, 172

(56) References Cited

U.S. PATENT DOCUMENTS

| | | | |
|---|---|---|---|
| 5,493,246 A | 2/1996 | Anderson | |
| 5,506,526 A | 4/1996 | Seesink | |
| 5,874,842 A | 2/1999 | Masuta | |
| 5,959,565 A | 9/1999 | Taniuchi et al. | |
| 5,977,803 A * | 11/1999 | Tsugai | 327/94 |
| 6,046,612 A | 4/2000 | Taft | |
| 6,515,612 B1 * | 2/2003 | Abel | 341/172 |
| 6,529,049 B2 * | 3/2003 | Erhart et al. | 327/94 |
| 6,563,348 B1 * | 5/2003 | Beck et al. | 327/94 |

FOREIGN PATENT DOCUMENTS

| | | |
|---|---|---|
| WO | WO 92/09990 A1 | 6/1992 |
| WO | WO 98/24092 A1 | 6/1998 |
| WO | WO 99/17122 A2 | 4/1999 |

OTHER PUBLICATIONS

"Dual 10-Bit, 40 Msps, 3V, Low-Power ADC with Internal Reference and Multiplexed Parallel Outputs", MAXIM Integrated Products, Rev. 0; Dec. 2001; http://pdfserv.maxim-ic.com/arpdf/MAX1186.pdf; rech. Sep. 5, 2003.

(Continued)

Primary Examiner—My-Trang Nu Ton
(74) Attorney, Agent, or Firm—Eschweiler & Associates, LLC

(57) ABSTRACT

An integrated circuit having a sample-and-hold device is provided, which can be operated in successive cycles which each include a sample phase and a hold phase. During a sample phase a first storage device is charged to a voltage value proportional to an analog input signal, which voltage value is provided for a further circuit part of the integrated circuit in the hold phase. A second storage device is charged during a first cycle to a voltage value which is inverted relative to a final voltage value of the first storage device in the hold phase. In the sample phase of the next cycle following the first cycle, the second storage device is connected to the first storage device in order to discharge the first storage device.

18 Claims, 3 Drawing Sheets

OTHER PUBLICATIONS

"A 13-b 2.5-MHz Self-Califbrated Pipelined A/D Converter in 3-$\mu$m CMOS", Yuh-Min Lin and Paul R. Gray, IEEE Journal of Solid-State Circuits, vol. 26, No. 4, Apr., 1991, 9 pgs.

"A 10-b 100-MS/s CMOS A/D Converter", Kwang Young Kim, Naoya Kusayanagi and Asad A Abidi, IEEE Journal of Solid-State Circuits, vol. 32, No. 3, Mar., 1997, 10 pgs.

"A 1.5-V, 10-bit, 14.3-MS/s CMOS Pipeline Analgo-to-Digital Converter", Andrew M. Abo and Paul R. Gray, IEEE Jounral of Solid-Stage Circuits, vol. 34, No. 5, May, 1999, 8 pgs.

* cited by examiner

SAMPLE-AND-HOLD WITH NO-DELAY RESET

This application is a continuation of copending International Application No. PCT/DE03/01106, having an international filing date of Apr. 3, 2003.

FIELD OF THE INVENTION

The invention relates to integrated circuits and, more particularly, to sample-and-hold devices.

BACKGROUND OF THE INVENTION

In some integrated circuits, for example those which utilize analog-to-digital converters, the sample-and-hold device is often a critical part. If the sample-and-hold device has a capacitive storage device for holding a sample, on the one hand, the charging time of the capacitive storage device limits the possible clock frequency (cycles of sample phase and hold phase per time) of the analog-to-digital converter and, on the other hand, residual charge from a previous sampling may still be present in the capacitive storage device, which leads to errors in the course of the analog-to-digital conversion. If the residual charge depends on a digital-to-analog conversion to be carried out, so-called intersymbol interference occurs. Such errors occur in particular in the case of analog-to-digital converter architectures in which a value determined in a manner dependent on the analog-to-digital conversion of the sample is added to or subtracted from the sample, as is carried out for example in pipeline architecture and two-step flash architecture.

It is therefore desirable to provide a sample-and-hold device in which the influence of a preceding cycle on a subsequent cycle can be reduced, minimized, or eliminated.

SUMMARY OF THE INVENTION

According to exemplary embodiments of the invention, a sample-and-hold device has an input stage (e.g. amplifier or buffer) having an input, to which an analog input signal can be applied, and an output, a first capacitive storage device, a reset device (or compensation device) and also a switching device. It is possible to operate the sample-and-hold device in successive cycles which each include a sample phase and a hold phase. In the sample phase the switching device connects the first storage device to the output of the input stage in order to store a voltage value proportional to the applied input signal in the first storage device, and in the hold phase the switching device isolates the first storage device from the output of the input stage in order to provide the stored voltage value for a further circuit, so that the first storage device stores a final voltage value at the end of the hold phase. The reset device (or compensation device) has a second capacitive storage device having the same capacitance as the first storage device and also a control circuit. During a first cycle, the control circuit effects a charging of the second storage device to a voltage value which is inverted with respect to the final voltage value with regard to a reference voltage. In the sample phase of a second cycle following the first cycle, the control circuit connects the second storage device to the first storage device in order to discharge the first storage device or to charge it to a signal-independent predetermined value.

Due to the connection of the two storage devices, a charge equalization is effected between the first and second storage devices in the sample phase of the second cycle, so that a defined initial state is generated independently of the final voltage value of the first storage device at the end of the hold phase of the first cycle, for which reason the input stage always sees the same precharge. In this case, the discharge of the first storage device is effected by the connection to the second storage device in the sample phase (preferably at the beginning of the sample phase) of the second cycle, so that there is no need to provide a separate discharge phase, which would disadvantageously lengthen the time until the next sample phase. The second storage device is thus discharged during the sample phase, so that the sample-and-hold device can be operated with a high clock frequency and it is ensured in this case that no residual charge of a preceding sample of the first cycle disadvantageously influences the sampling in the second cycle. Intersymbol interference is thus prevented as well.

The cycles are preferably carried out in direct succession, thereby once again enabling a high clock frequency, it being possible to carry out a discharge of the first storage device in each sample by connection to the second storage device that was correspondingly precharged in the respectively preceding cycle.

The input stage may be an input node or else a drive (e.g. a differential amplifier or operational amplifier).

In some embodiments, for the purpose of charging the second storage device, the control circuit applies to the second storage device during the sample phase of the first cycle a voltage which is inverted with respect to a voltage applied to the first storage device during the sample phase, with regard to the reference voltage. As a result, the second storage device is already charged to the desired voltage value during the sample phase (if the final voltage of the first storage device does not change during the hold phase), so that the discharge (or the charging to the predetermined value) can be reliably carried out during the sample phase of the second cycle.

For the purpose of charging the second storage device, the control circuit may apply to the second storage device during the hold phase of the first cycle a voltage which is inverted with respect to a voltage applied to the first storage device during the hold phase, with regard to the reference voltage. This is particularly advantageous for an analog-to-digital converter in which, in the hold phase, another voltage value, such as e.g. a digital-to-analog value, is added to the held voltage value, as is the case in particular in analog-to-digital converters with a pipeline architecture (as is described e.g. in A. Abo et al., "A 1.5-V, 10-bit, 14.3-MS/s CMOS Pipeline Analog-to-Digital Converter", IEEE Journal of Solid State Circuits, Volume 34, No. 5, pp. 599–606, May 1999) or two-step flash architecture. Consequently, the discharging of the first storage device (or the charging to the predetermined value) during the sample phase of the second cycle is ensured in this case, to.

Furthermore, in some embodiments, the control circuit may effect a charging of the second storage device during the second and the subsequent cycles in each case to a voltage value which is inverted with respect to the final voltage value of the first storage device of this cycle with regard to the reference voltage, and, in the sample phase of the third and respectively the further cycles, said control circuit may connect the further storage device to the first storage device. This ensures that the first storage device is in each case discharged in the sample phases of the second and further samples, so that the input stage in each case sees the same precharge in the sample phase.

Furthermore, in some embodiments, the first and second storage devices may in each case have a capacitor, which are connected in parallel in the event of connection in the sample phase of the second cycle and preferably also of the further cycles. This refinement makes it possible to realize the first and second storage devices in a particularly simple manner.

Moreover, in some embodiments, the first and second storage devices may in each case have a plurality of capacitors that are connected in parallel during the sample phase, each capacitor of the first storage device being assigned a capacitor of the second storage device for one cycle. Each of these capacitor pairs is charged in the preceding cycle, in the manner described, to a mutually inverted voltage with regard to the reference voltage, so that a connection (connection in parallel) of the capacitor pairs during the sample phase of the cycle leads to the desired discharging. The assignment of the capacitors may be identical for all the cycles, on the one hand, or only for even-numbered and odd-numbered cycles, on the other hand.

The invention may be used in an integrated circuit formed in particular as a digital-to-analog converter. An analog-to-digital converter which can realize very high clock frequencies is thus provided.

In an exemplary design according to the invention the first storage device comprises a first and a second capacitor and the second storage device comprises a third and a fourth capacitor, the first and third capacitors and also the second and fourth capacitors in each case having the same capacitance. The input stage comprises a differential amplifier, to which a (preferably differential) analog input signal can be applied and the output of which has an inverting and a noninverting output terminal. In the sample phase the switching device connects the first capacitor to the noninverting output terminal and the second capacitor to the inverting output terminal. The control circuit, for the purpose of charging during the first cycle, has the effect that the third capacitor is charged to a final voltage value which is inverted with respect to the final voltage value of the first capacitor with regard to the reference voltage, and the fourth capacitor is charged to a final voltage value which is inverted with respect to the final voltage value of the second capacitor with regard to the reference voltage. In the sample phase of the next cycle the control circuit connects the first capacitor to the third capacitor and the second capacitor to the fourth capacitor.

Thus, the invention is applicable to an integrated circuit having a sample-and-hold device of fully differential design, and the advantages described above are also realized in the case of the fully differential embodiment. In particular, the required inverted voltages are already provided in the case of the fully differential embodiment, with the result that the circuitry realization is particularly simple.

In some embodiments, in sample phases of even-numbered cycles the control circuit may connect the third capacitor in parallel with the first capacitor and the fourth capacitor in parallel with the second capacitor, and in sample phases of odd-numbered cycles the control circuit may connect the third capacitor in parallel with the second capacitor and the fourth capacitor in parallel with the first capacitor. In one such example, all four capacitors have the same capacitance. This constitutes a particularly simple realization for the case in which the stored voltage values on the first and second capacitors are not altered during the hold phase.

Furthermore, in some embodiments, the first and second storage devices may each have the same number of capacitors having the same capacitance, which capacitors are connected in parallel during the sample phase. Thus, on the one hand, high capacitances can easily be realized and, on the other hand, it is possible to realize multistage analog-to-digital converters in which each stage can output a plurality of bits of the digitized value to be generated.

In some embodiments, the sample-and-hold device comprises an input stage having an input, to which an analog input signal can be applied, and an output, a first inductive storage device, a reset device and also a switching device. It is possible to operate the sample-and-hold device in successive cycles which each include a sample phase and a hold phase. In the sample phase the switching device connects the first storage device to the output of the input stage in order to store a current value proportional to the applied input signal in the first storage device, and in the hold phase the switching device isolates the first storage device from the output of the input stage in order to provide the stored current value for a further circuit, so that the first storage device stores a final current value at the end of the hold phase. The reset device has a second inductive storage device having the same inductance as the first storage device and also a control circuit. During a first cycle, the control circuit effects a charging of the second storage device to a current value which is inverted with respect to the final current value with regard to a reference current. In the sample phase of a second cycle following the first cycle, the control circuit connects the second storage device to the first storage device in order to discharge the first storage device or to charge it to a signal-independent predetermined value.

Exemplary embodiments of the invention thus effectively prevent the sampling during one cycle from being influenced by the sample or the final current value in the previous cycle.

Embodiments that use inductive storage devices can be developed in the same way as has been described with regard to the use of capacitive storage devices, but using inductances instead of capacitors, and storing current values instead of voltage values.

BRIEF DESCRIPTION OF THE DRAWINGS

The invention is explained in even more detail by way of example in principle below with reference to the drawings, in which.

DETAILED DESCRIPTION OF THE DRAWINGS

Figure 1:
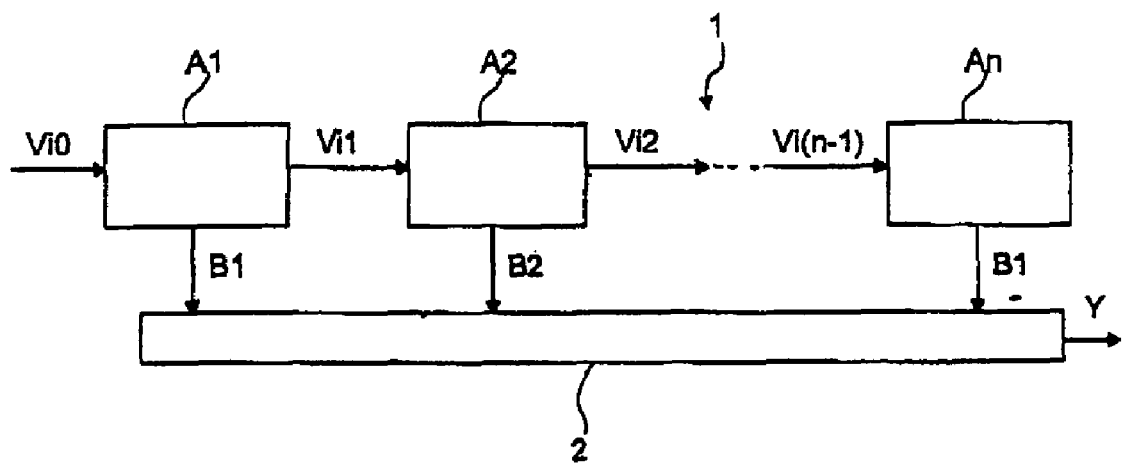
FIG. 1 shows a schematic circuit diagram of exemplary embodiments of an integrated circuit according to the invention.

FIG. 1 shows an analog-to-digital converter 1 having a pipeline construction as an example of an integrated circuit according to the invention. The analog-to-digital converter 1 is for converting an analog input voltage Vi0 into a digital value Y having m bits, and contains n cascaded stages A1, A2, . . . An which respectively generate a binary value B1, B2, . . . Bn having one or more bits for use in producing the digital value Y. These binary values are applied to a digital unit 2, which outputs the desired digital value Y. The individual bits B1, B2, . . . Bn are generated in temporal succession, the first stage A1 generating the bit value B1 from the analog value Vi0 present and outputting the bit value to the digital unit 2 and applying an analog value Vi1 that has been processed in a known way to the second stage A2. This is continued until the last stage An also outputs the corresponding bit value Bn to the digital unit 2, which can then generate the digital value Y.

Figure 2:
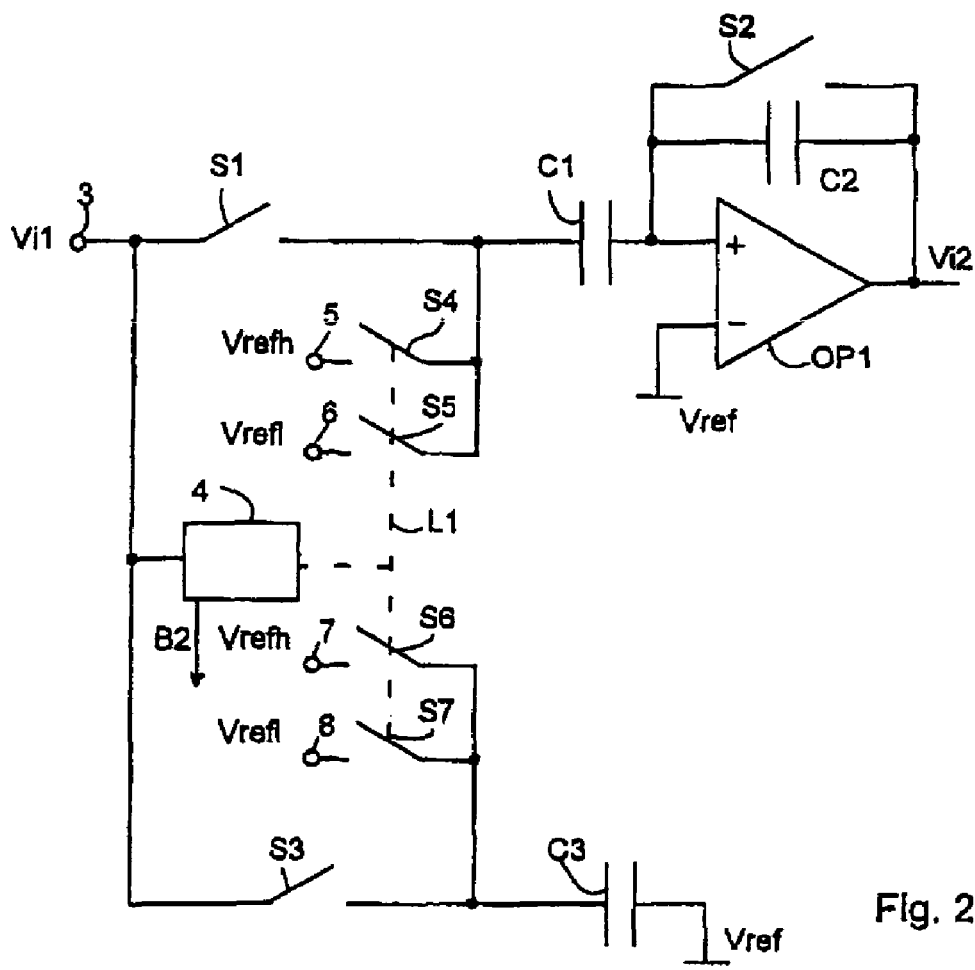
FIG. 2 shows a schematic circuit diagram of exemplary embodiments of a stage of the integrated circuit shown in FIG. 1.

The second stage A2 is illustrated in greater detail in FIG. 2 as an example of the construction of the stages A1 to An. The analog input voltage Vi1 of the first stage A1 is present at an input node 3. The first node 3 is connected via a first switch S1 to a first terminal of a storage capacitor C1, the second terminal of which is connected to a noninverting input of a differential amplifier (or operational amplifier) OP1. The noninverting input of the differential amplifier OP1 is connected to the output of the differential amplifier OP1 via a feedback capacitor C2, a second switch S2 being connected in parallel with the feedback capacitor C2. The inverting input of the differential amplifier OP1 is at a predetermined reference potential Vref (e.g., 0 volts).

The first node 3 is furthermore connected to an analog-to-digital converter unit 4, which is only illustrated schematically, so that the analog input voltage Vi1 is also present at the analog-to-digital converter unit 4. During operation, the analog-to-digital converter unit 4 outputs the binary value B2.

Furthermore, the first node 3 is connected via a third switch S3 to a first terminal of a reset capacitor (or compensation capacitor) C3, the second terminal of the reset capacitor C3 being at the same potential (reference potential Vref) as the inverting input of the differential amplifier OP1.

The capacitance of the storage capacitor C1 is of the same magnitude as the capacitance of the reset capacitor C3 and also the capacitance of the feedback capacitor C2.

The storage capacitor C1 can be connected to a second node 5, which is at a first potential Vrefh (here for example +2 volts), via a fourth switch S4 and to a third node 6, which is at a second potential Vrefl (here in the example −2 volts), via a fifth switch S5. The reset capacitor C3 can be connected to a fourth node 7, which is at the first potential Vrefh, via a sixth switch S6 and to a fifth node 8, which is at the second potential Vrefl, via a seventh switch S7.

The fourth to seventh switches S4 to S7 are opened and closed in a manner dependent on the result of the analog-to-digital converter unit 4, as is indicated by the dashed line L1. The first to third switches S1 to S3 are opened and closed by means of a control device (not shown). The switches S1 to S7, the control device (not shown) of the switches S1 to S3, the analog-to-digital converter unit 4 and the capacitors C1 and C3 form a sample-and-hold device of the second stage A2.

During operation of the analog-to-digital converter 1, the analog voltage Vi0, Vi1, . . . Vi(n−1) present is sampled during a sample phase in each of the stages A1, A2, . . . An. In the case of the stage A2, the voltage Vi1 is present at the first node (input node) 3. During the sample phase the switches S1, S2 and S3 are closed and the switches S4 to S7 are open. At the end of the sample phase, the switches S1 to S3 are opened, so that the analog value of the voltage Vi1 present last is stored in the storage capacitor C1 and is also present at the reset capacitor C3, which was connected in parallel with the storage capacitor C1 during the sample phase. In the example described here, it is assumed that the voltage at the storage capacitor C1 and at the reset capacitor C3 is 1.5 volts.

In the hold phase that then follows, the analog-to-digital converter unit 4 outputs the binary value B2 and, in a manner dependent on the analog-to-digital conversion that is carried out, selectively closes the switches S4 and S5 in order to add or subtract a predetermined voltage to or from the held (stored) voltage of the storage capacitor C1, the result being amplified by the differential amplifier OP1.

In the example described, it is assumed that the switch S4 is closed. This has the effect that the storage capacitor C1 is pulled to the potential Vrefh, since the noninverting input of the differential amplifier OP1 is at Vref and thus acts as a virtual ground. In this case, the desired analog output voltage Vi2 is generated at the output of the differential amplifier OP1. Consequently, the differential amplifier OP1 can be considered as an input stage of the third stage A3 (not shown). The differential amplifier OP1 can also be omitted, in which case the respective second terminals of the storage and reset capacitors C1 and C3 are held at the same potential.

If the switch S7 is also closed during the hold phase, the reset capacitor C3 is pulled to Vrefl. At the end of the hold phase, the switches S4 and S7 are opened again, so that the storage capacitor C1 and the reset capacitor C3 are at mutually inverted voltages with respect to the reference potential Vref.

The switches S5 to S8 are thus always actuated in such a way that the capacitors C1 and C3 are at mutually inverted voltages at the end of the hold phase.

These sample and hold phases described are carried out continuously one after the other, so that in the sample phase that then follows, when the switches S1 to S3 are closed again, a charge equalization takes place between the storage capacitor C1 and the reset capacitor C3, so that both capacitors C1 and C3 are discharged (or the interconnected terminals of the capacitors C1 and C3 are at the reference voltage Vref (here 0 volts)). As an alternative, given a suitable choice of Vref, in each sample phase, the two capacitors C1 and C3 can also be charged to a signal-independent predetermined value (which differs from 0 volts but is the same in each sample phase). A defined initial state is thus generated at the beginning of the sample phase, this not necessitating a separate reset phase before the sample phase. What is thereby achieved is that the sample or the voltage value on the storage capacitor C1 at the end of the previous hold phase has no influence on the subsequent sample phase. Consequently, so-called intersymbol interference is avoided.

Figure 3:
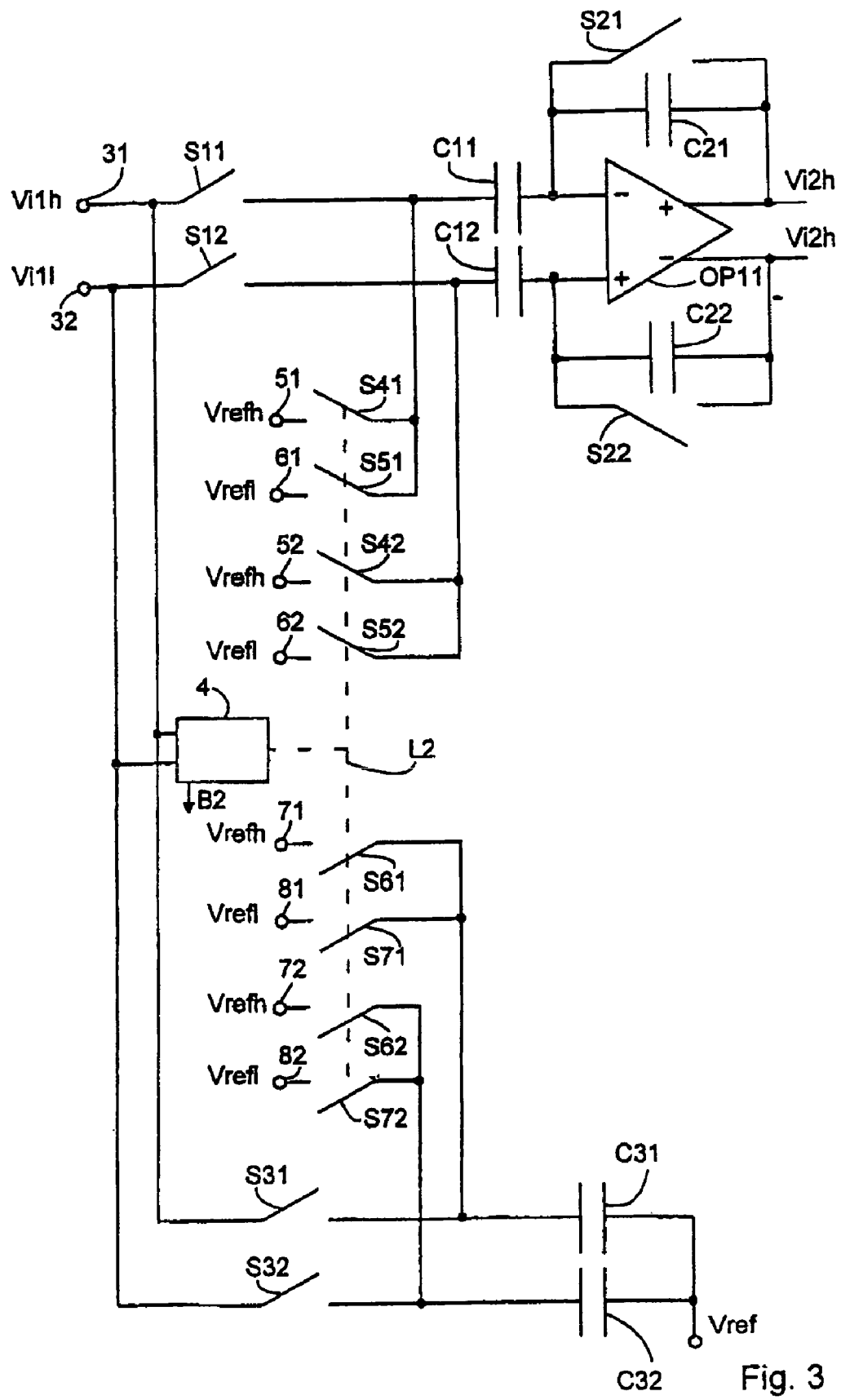
FIG. 3 shows further exemplary embodiments of a stage of the integrated circuit of FIG. 1.

FIG. 3 shows an embodiment of the second stage A2 for the case of the fully differential design of the analog-to-digital converter of FIG. 1. Therefore, on the input side, the second stage has two input nodes 31 and 32, at which the two components Vi1h and Vi1l of the analog input voltage Vi1 are present, the components being inverted with respect to one another with regard to a reference potential Vref (here e.g. 2.5 V).

The input node 31 can be connected via a switch S11 to a first terminal of a first storage capacitor C11, the second terminal of the first storage capacitor C11 being connected to an inverting input of a differential amplifier (operational amplifier) OP11. The inverting input of the differential amplifier 11 is connected to the non-inverting output of the differential amplifier OP11 via a first feedback capacitor C21, a switch S21 being connected in parallel with the first feedback capacitor C21.

In the same way, the second input node 32 can be connected via a switch S12 to a first terminal of a second storage capacitor C12. The second terminal of the second storage capacitor C12 is connected to the noninverting input of the differential amplifier OP11. The noninverting input of the differential amplifier OP11 is connected to the inverting output of the differential amplifier OP11 via a second feedback capacitor C22, a switch S22 additionally being connected in parallel with the second feedback capacitor C22.

The input nodes 31 and 32 are connected to the analog-to-digital converter unit 4, which carries out the analog-to-digital conversion and outputs the binary value B2.

The second stage A2 furthermore contains first and second reset capacitors C31 and C32, it being possible for the first terminal of the first reset capacitor C31 to be connected to the first input node 31 via a switch S31 and for the first terminal of the second reset capacitor C32 to be connected to the second input node 32 via a switch S32. The second terminals of the two reset capacitors C31, C32 are at the reference potential Vref (here 2.5 V), which corresponds to the common-mode voltage of the differential amplifier OP11. The storage capacitors C11, C12, the reset capacitors C31 and C32 and the feedback capacitors C21 and C22 in each case have the same capacitance.

As an alternative, the two storage capacitors C11 and C12 may have different capacitances. In this case, the reset or compensation capacitor C31 then has the same capacitance as the storage capacitor C11 and the capacitance of the reset or compensation capacitor C32 corresponds to that of the storage capacitor C12.

The first terminal of the first storage capacitor C11 can be connected to a node 51, which is at a first potential Vrefh (here e.g. 4 V), via a switch S41 and to a node 61, which is at a second potential Vrefl (here e.g. 1 V), via a switch S51. The first potential Vrefh is inverted with respect to the second potential Vrefl with regard to the reference potential. In the same way, the first terminal of the second storage capacitor C12 can be connected to a node 52, which is at the first potential Vrefh, via a switch S42 and to a node 62, which is at the second potential Vrefl, via a switch S52.

The first terminal of the first reset capacitor C31 can be connected to a node 71, which is at the first potential Vrefh, via a switch S61 and to a node 81, which is at the second potential Vrefl, via a switch S71. In the same way, the first terminal of the second reset capacitor C32 can be connected to a node 72, which is at the first potential Vrefh, by means of a switch S62 and to a node 82, which is at the second potential Vrefl, by means of a switch S72.

The switches S41, S42, S51, S52, S61, S62, S71 and S72 are opened and closed in a manner dependent on the conversion result of the analog-to-digital converter unit 4, as is indicated by the dashed line L2 in FIG. 3.

The switches S11, S12, S21, S22, . . . S72, the capacitors C11, C12, C31, C32, the converter unit 4 and also a control device (not shown) for the switches S11, S12, S21, S22, S31, S32 form a sample-and-hold device, in which case the amplifier of the preceding stage A1 may also be considered as an input stage of the sample-and-hold device.

The differential amplifier OP11 can also be omitted, in which case the second terminals of the storage and reset capacitors are held at the same potential.

During operation of the analog-to-digital converter 1, the analog voltage Vi1h and Vi1l are present at the second stage A2 in the sample phase, the switches S11, S12, S21, S22, S31 and S32 being closed and the remaining switches being open in the sample phase. The switches S11, S12, S21, S22 and also S31 and S32 are opened at the end of the sample phase. Assuming that the voltage Vi1h was 3 V and the voltage Vi1l was 2 V at this point in time, the voltage at the first storage capacitor C11 is 0.5 V (the reference voltage of 2.5 V is present at the second terminal of the first storage capacitor C11) and the voltage at the second storage capacitor C12 is −0.5 V. In the same way, a voltage of 0.5 V is present at the first reset capacitor C31, while a voltage of −0.5 V is present at the second reset capacitor C32.

In the hold phase following the sample phase, the analog-to-digital converter unit 4 outputs the binary value B2 and drives the switches S41, S42, . . . S72 for example in such a way as to close the switches S41, S52, S71 and also S62. The result of this is that the first potential Vrefh is applied to the first terminal of the first storage capacitor C11, so that the first storage capacitor is at 1.5 V and the desired analog output voltage Vi2h is generated on account of the feedback via the feedback capacitor C21 at the noninverting input of the differential amplifier OP11. Since the switch S52 is also closed, the second potential Vrefl is applied to the first terminal of the second storage capacitor C12, so that the second storage capacitor C12 has a voltage of −1.5 V and the desired analog voltage Vi2l for the next stage A3 is generated on account of the feedback via the feedback capacitor C22 at the inverting output of the differential amplifier OP11.

Furthermore, during the hold phase, on account of the closed switch S71, Vrefl is applied to the first terminal of the first reset capacitor C31, so that the first capacitor C31 stores a voltage of −1.5 V. The second reset capacitor C32 stores the inverted voltage of 1.5 V with respect thereto with regard to the reference voltage Vref since the switch S62 is closed and Vrefh is thus applied to the first terminal of the second reset capacitor C32. The switches S41, S52, S71 and also S62 are opened again at the end of the hold phase, so that the first storage capacitor C11 and the first reset capacitor C31 store mutually inverted voltages with respect to the reference potential Vref and the second storage capacitor C12 and the second reset capacitor C32 also store mutually inverted voltages with respect to the reference potential Vref.

Since the sample phase and hold phase described are carried out continuously one after the other, in the sample phase that then follows, when the switches S11, S12, S21, S22, S31 and also S32 are closed, a charge equalization takes place between the first storage capacitor C11 and the first reset capacitor C31 and also between the second storage capacitor C12 and the second reset capacitor C32, which has the effect that both the storage and reset capacitors C11, C12, C31, C32 are discharged. To put it another way, the first terminals of the storage capacitors and of the reset capacitors are brought to the reference potential Vref on account of the charge equalization, so that the voltage at the storage and reset capacitors C11, C12, C31, C32 is 0 V in each case.

A defined initial state which is independent of the charge state of the storage capacitors C11, C12 at the end of the preceding hold phase is thus generated at the beginning of each sample phase. In this case, this generation of the defined initial state for each sample phase is effected directly at the beginning of the sample phase itself, so that there is no need for a separate reset phase in which the storage capacitors are discharged by means of additional switches, which would take up unnecessary time.

The numerical values of the capacitor voltages in the above description relate to the settled state (quasi-steady state). The function or the behavior of the circuits described is equivalent for the dynamic case, so that then, too, a defined initial state is generated at the beginning of each sample phase.

Figure 4:
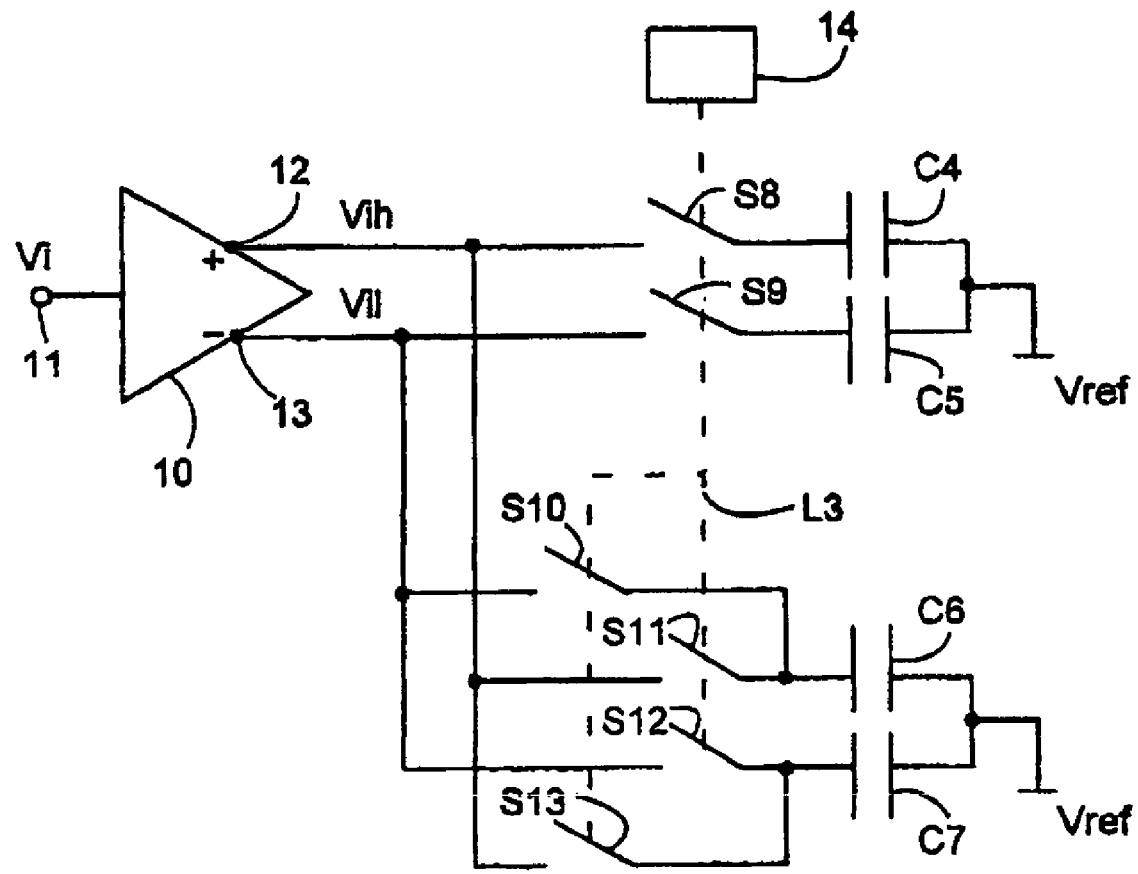
FIG. 4 shows a schematic circuit diagram of further exemplary embodiments of a sample-and-hold device according to the invention.

FIG. 4 shows a further embodiment of a sample-and-hold device which is of fully differential design.

The sample-and-hold device contains a driver input stage 10 having an input terminal 11, to which an analog input voltage Vi can be applied, and having a noninverting output terminal 12 and an inverting output terminal 13.

The noninverting output terminal 12 is connected via a switch S8 to a first terminal of a first storage capacitor C4, the second terminal of which is at a predetermined reference potential Vref (here 0 V). The inverting output terminal 13 is connected via a switch S9 to a first terminal of a second storage capacitor C5, the second terminal of the second storage capacitor C5 being at the predetermined reference potential Vref.

Furthermore, a first reset capacitor C6 is provided, the first terminal of which can be connected to the inverting output terminal 13 of the driver input stage 10 via a switch S10 and to the noninverting output terminal 12 via a switch S11. The second terminal of the first reset capacitor C6 is at the reference potential Vref.

Furthermore, a second reset capacitor C7 is additionally provided, the first terminal of which can be connected to the inverting output terminal 13 via a switch S12 and to the noninverting output terminal 12 of the driver input stage 10 via a switch S13. The switches S8 to S13 are opened and closed by means of a schematically depicted control circuit 14.

The first storage capacitor C4, the second storage capacitor C5, the first reset capacitor C6 and the second reset capacitor C7 in each case have the same capacitance.

During operation, the sample-and-hold device is operated in successive cycles with in each case a sample phase and a hold phase.

In the sample phase of a first cycle, the switches S8, S9, S11 and also S12 are closed and the switches S10 and S13 are opened, by means of the control circuit 14. Consequently, an analog voltage Vih is present at the first storage capacitor C4 and at the first reset capacitor C6, this analog voltage being output by the drive input stage 10 when voltage Vi is present on the input side, while the analog voltage Vil output by the input driver stage 10 is present at the second storage capacitor C5 and at the second reset capacitor C7. The switches S8, S9, S11 and also S12 are opened at the end of the sample phase, so that the voltage of the first storage capacitor C4 is correspondingly equal to the voltage of the first reset capacitor C6 (here e.g. +4 V). Furthermore, the voltage at the second storage capacitor C5 corresponds to the voltage at the second reset capacitor C7. This is −4 V in the exemplary embodiment described here.

In the hold phase that then follows, the voltages stored in the storage capacitors C4 and C5 can be evaluated in further circuits or circuit parts (not shown), but the voltages at the storage capacitors C4 and C5 themselves are not altered or are only slightly altered. As an alternative, the voltages at the reset capacitors are changed in accordance with a change in the voltages at the storage capacitors C4 and C5.

In the subsequent sample phase of a second cycle following the first cycle, the switches S8 and S9 and also the switches S10 and S13 are closed by means of the control circuit 14. This has the effect that a charge equalization takes place between the first storage capacitor C4, which is at +4 V in the example described here, and the second reset capacitor C7, which is at −4 V, so that both capacitors are discharged to 0 V. The same applies to the second storage capacitor C5 and the first reset capacitor C6, which are also connected to one another. Therefore, the storage capacitors C4 and C5 are discharged at the beginning of the sample phase. During the sample phase, the two storage capacitors C4 and C5 and also the two reset capacitors C6 and C7 are charged to mutually inverted voltages in each case. The sample phase is again followed by a hold phase and this hold phase is followed by a further sample phase in which the first reset capacitor C6 is then again connected in parallel with the first storage capacitor C4 and the second reset capacitor C7 is connected in parallel with the second storage capacitor C5.

Consequently, the same precharge can be seen for the driver input stage 10 for each sample phase, to be precise independently of what voltage value was stored in the storage capacitors C4 and C5 in the preceding hold phase.

The sample-and-hold device shown in FIG. 4 may be used for example in the analog-to-digital converter unit 4 shown in FIGS. 2 and 3.

The integrated circuit and sample-and-hold embodiments described above may be realized for example using bipolar technology, CMOS technology or else BiCMOS technology, it being possible for the switches mentioned to be realized by transistors.

In the embodiments described, the storage devices and also the reset devices are in each case realized capacitively. However, an inductive realization is also possible, in which case coils or inductances are then used instead of the capacitors, and currents rather than voltages are stored. The precise configuration with coils or inductances can readily be implemented by the person skilled in the art.

Although exemplary embodiments of the invention are described above in detail, this does not limit the scope of the invention, which can be practiced in a variety of embodiments.

What is claimed is:

1. An apparatus for performing a sample-and-hold operation in each of a series of operational cycles that each include a sample phase followed by a hold phase, comprising:
    an input stage having an input for receiving an analog input signal, and having an output;
    a first capacitive storage device coupled to said input and said output;
    a switching device coupled to the first capacitive storage device, the switching device for establishing a coupling between the first capacitive storage device and the input during the sample phase in order to store in the first capacitive storage device for eliminating said coupling during the hold phase, the switching device further for causing the first capacitive storage device to store a final voltage upon completion of the hold phase; and
    a second capacitive storage device coupled to the switching device, the first and second capacitive storage devices having respective capacitances which are equal to one another, the switching device for establishing a coupling between the second capacitive storage device and the input during the sample phase in order to store in the second capacitive storage device said first voltage representative of the analog input signal, the switching device for eliminating said coupling during the hold phase, the switching device for effecting a charging of the second capacitive storage device to an inverted voltage upon completion of the hold phase, said switching device for connecting the second capacitive storage device to the first capacitive storage device during the sample phase in order to discharge the first capacitive storage device.

2. The apparatus of claim 1, wherein the switching device is for effecting the charging of the second capacitive storage device during the sample phase.

3. The apparatus of claim 1, wherein the switching device is for effecting the charging of the second capacitive storage device during the hold phase.

4. The apparatus of claim 1, wherein the first and second capacitive storage devices respectively include first and second capacitors, and wherein the switching device is for connecting the first and second capacitors in parallel during the sample phase.

5. The apparatus of claim 1, provided in an analog-to-digital converter integrated circuit.

6. The apparatus of claim 1, wherein the first capacitive storage device includes first and second capacitors, and wherein the second capacitive storage device includes third and fourth capacitors, the first and third capacitors having respective capacitances which are equal to one another and the second and fourth capacitors having respective capacitances which are equal to one another, the input stage including a differential amplifier having an output which includes inverting and non-inverting output terminals, the switching device operable during the sample phase for connecting the first and second capacitors respectively to the non-inverting and inverting output terminals, the switching device for causing the first and second capacitors to store respective first and second final voltages upon completion of the hold phase, the switching device for effecting charging of the third capacitor to a first inverted voltage, said first inverted voltage and said first final voltage mutually inverted relative to the reference voltage, the switching device for effecting charging of the fourth capacitor to a second inverted voltage, said second inverted voltage and said second final voltage mutually inverted relative to the reference voltage, the switching device for connecting the first and second capacitors respectively to the third and fourth capacitors during the sample phase.

7. The apparatus of claim 6, wherein the switching device is for connecting the first and second capacitors respectively in parallel with the third and fourth capacitors during the sample phase of some of the operational cycles, and wherein the switching device is for connecting the first and second capacitors respectively in parallel with the fourth and third capacitors during the sample phase of others of the operational cycles, wherein said some operational cycles occur in temporally alternating fashion with said other operational cycles.

8. The apparatus of claim 1, wherein the first and second capacitive storage devices respectively include first and second pluralities of capacitors, the capacitors of the first and second pluralities having respective capacitances which are all equal to one another, the switching device for connecting all of the capacitors of the first and second pluralities in parallel with one another during the sample phase.

9. An apparatus for performing a sample-and-hold operation in each of a series of operational cycles that each include a sample phase followed by a hold phase, comprising:
an input stage having an input for receiving an analog input signal, and having an output;
a first capacitive storage device coupled to said input and said output;
a switching device coupled to the first capacitive storage device, the switching device for establishing a coupling between the first capacitive storage device and the input during the sample phase in order to store in the first capacitive storage device for eliminating said coupling during the hold phase, the switching device further for causing the first capacitive storage device to store a final voltage upon completion of the hold phase; and
a second capacitive storage device coupled to the switching device, the first and second capacitive storage devices having respective capacitances which are equal to one another, the switching device for effecting a charging of the second capacitive storage device to an inverted voltage, said switching device for connecting the second capacitive storage device to the first capacitive storage device during the sample phase in order to discharge the first capacitive storage device,
wherein the switching device is for effecting the charging of the second capacitive storage device during the sample phase, and
wherein the first capacitive storage device includes first and second capacitors, and wherein the second capacitive storage device includes third and fourth capacitors, the first and third capacitors having respective capacitances which are equal to one another and the second and fourth capacitors having respective capacitances which are equal to one another, the input stage including a differential amplifier having an output which includes inverting and non-inverting output terminals, the switching device operable during the sample phase for connecting the first and second capacitors respectively to the non-inverting and inverting output terminals, the switching device for causing the first and second capacitors to store respective first and second final voltages upon completion of the hold phase, the switching device for effecting charging of the third capacitor to a first inverted voltage, said first inverted voltage and said first final voltage mutually inverted relative to the reference voltage, the switching device for effecting charging of the fourth capacitor to a second inverted voltage, said second inverted voltage and said second final voltage mutually inverted relative to the reference voltage, the switching device for connecting the first and second capacitors respectively to the third and fourth capacitors during the sample phase.

10. The apparatus of claim 9, wherein the switching device is for connecting the first and second capacitors respectively in parallel with the third and fourth capacitors during the sample phase of some of the operational cycles, and wherein the switching device is for connecting the first and second capacitors respectively in parallel with the fourth and third capacitors during the sample phase of others of the operational cycles, wherein said some operational cycles occur in temporally alternating fashion with said other operational cycles.

11. An apparatus for performing a sample-and-hold operation in each of a series of operational cycles that each include a sample phase followed by a hold phase, comprising:
an input stage having an input for receiving an analog input signal, and having an output;
a first capacitive storage device coupled to said input and said output;
a switching device coupled to the first capacitive storage device, the switching device for establishing a coupling between the first capacitive storage device and the input during the sample phase in order to store in the first capacitive storage device for eliminating said coupling during the hold phase, the switching device further for causing the first capacitive storage device to store a final voltage upon completion of the hold phase; and
a second capacitive storage device coupled to the switching device, the first and second capacitive storage devices having respective capacitances which are equal to one another, the switching device for effecting a charging of the second capacitive storage device to an inverted voltage, said switching device for connecting the second capacitive storage device to the first capacitive storage device during the sample phase in order to discharge the first capacitive storage device wherein the switching device is for effecting the charging of the second capacitive storage device during the hold phase, and wherein the first capacitive storage device includes first and second capacitors, and wherein the second capacitive storage device includes third and fourth capacitors, the first and third capacitors having respective capacitances which are equal to one another and the second and fourth capacitors having respective capacitances which are equal to one another, the input stage including a differential amplifier having an output which includes inverting and non-inverting output terminals, the switching device operable during the sample phase for connecting the first and second capacitors respectively to the non-inverting and inverting output terminals, the switching device for causing the first and second capacitors to store respective first and second final voltages upon completion of the hold phase, the switching device for effecting charging of the third capacitor to the first inverted voltage, said first inverted voltage and said first final voltage mutually inverted relative to the reference voltage, the switching device for effecting charging of the fourth capacitor to a second inverted voltage, said second inverted voltage and said second final voltage mutually inverted relative to the reference voltage, the switching device for connecting the first and second capacitors respectively to the third and fourth capacitors during the sample phase.

12. The apparatus of claim 11, wherein the switching device is for connecting the first and second capacitors respectively in parallel with the third and fourth capacitors during the sample phase of some of the operational cycles, and wherein the switching device is for connecting the first and second capacitors respectively in parallel with the fourth and third capacitors during the sample phase of others of the operational cycles, wherein said some operational cycles occur in temporally alternating fashion with said other operational cycles.

13. An apparatus for performing a sample-and-hold operation in each of a series of operational cycles that each include a sample phase followed by a hold phase, comprising:

an input stage having an input for receiving an analog input signal, and having an output;

a first capacitive storage device coupled to said input and said output;

a switching device coupled to the first capacitive storage device, the switching device for establishing a coupling between the first capacitive storage device and the input during the sample phase in order to store in the first capacitive storage device for eliminating said coupling during the hold phase, the switching device further for causing the first capacitive storage device to store a final voltage upon completion of the hold phase; and a second capacitive storage device coupled to the switching device, the first and second capacitive storage devices having respective capacitances which are equal to one another, the switching device for effecting a charging of the second capacitive storage device to an inverted voltage, said switching device for connecting the second capacitive storage device to the first capacitive storage device during the sample phase in order to discharge the first capacitive storage device, wherein the first and second capacitive storage devices respectively include first and second capacitors, and wherein the switching device is for connecting the first and second capacitors in parallel during the sample phase, and wherein the first capacitive storage device includes first and second capacitors, and wherein the second capacitive storage device includes third and fourth capacitors, the first and third capacitors having respective capacitances which are equal to one another and the second and fourth capacitors having respective capacitances which are equal to one another, the input stage including a differential amplifier having an output which includes inverting and non-inverting output terminals, the switching device operable during the sample phase for connecting the first and second capacitors respectively to the non-inverting and inverting output terminals, the switching device for causing the first and second capacitors to store respective first and second final voltages upon completion of the hold phase, the switching device for effecting charging of the third capacitor to a first inverted voltage, said first inverted voltage and said first final voltage mutually inverted relative to the reference voltage, the switching device for effecting charging of the fourth capacitor to a second inverted voltage, said second inverted voltage and said second final voltage mutually inverted relative to the reference voltage, the switching device for connecting the first and second capacitors respectively to the third and fourth capacitors during the sample phase.

14. The apparatus of claim 13, wherein the switching device is for connecting the first and second capacitors respectively in parallel with the third and fourth capacitors during the sample phase of some of the operational cycles, and wherein the switching device is for connecting the first and second capacitors respectively in parallel with the fourth and third capacitors during the sample phase of others of the operational cycles, wherein said some operational cycles occur in temporally alternating fashion with said other operational cycles.

15. An apparatus for performing a sample-and-hold operation in each of a series of operational cycles that each include a sample phase followed by a hold phase, comprising:

an input stage having an input for receiving an analog input signal, and having an output;

a first capacitive storage device coupled to said input and said output;

a switching device coupled to the first capacitive storage device, the switching device for establishing a coupling between the first capacitive storage device and the input during the sample phase in order to store in the first capacitive storage device for eliminating said coupling during the hold phase, the switching device further for causing the first capacitive storage device to store a final voltage upon completion of the hold phase; and a second capacitive storage device coupled to the switching device, the first and second capacitive storage devices having respective capacitances which are equal to one another, the switching device for effecting a charging of the second capacitive storage device to an inverted voltage, said switching device for connecting the second capacitive storage device to the first capacitive storage device during the sample phase in order to discharge the first capacitive storage device, wherein the first capacitive storage device includes first and second capacitors, and wherein the second capacitive storage device includes third and fourth capacitors, the first and third capacitors having respective capacitances which are equal to one another and the second and fourth capacitors having respective capacitances which are equal to one another, the input stage including a differential amplifier having an output which includes inverting and non-inverting output terminals, the switching device operable during the sample phase for connecting the first and second capacitors respectively to the non-inverting and inverting output terminals, the switching device for causing the first and second capacitors to store respective first and second final voltages upon completion of the hold phase, the switching device for effecting charging of the third capacitor to a first inverted voltage, said first inverted voltage and said first final voltage mutually inverted relative to the reference voltage, the switching device for effecting charging of the fourth capacitor to a second inverted voltage, said second inverted voltage and said second final voltage mutually inverted relative to the reference voltage, the switching device for connecting the first and second capacitors respectively to the third and fourth capacitors during the sample phase.

16. The apparatus of claim 15, wherein the switching device is for connecting the first and second capacitors respectively in parallel with the third and fourth capacitors during the sample phase of some of the operational cycles, and wherein the switching device is for connecting the first and second capacitors respectively in parallel with the fourth and third capacitors during the sample phase of others of the operational cycles, wherein said some operational cycles occur in temporally alternating fashion with said other operational cycles.

17. An apparatus for performing a sample-and-hold operation in each of a series of operational cycles that each include a sample phase followed by a hold phase, comprising:

an input stage having an input for receiving an analog input signal, and having an output;

a first electrical storage device coupled to said input and said output;

a switching device coupled to the first electrical storage device, the switching device for establishing a coupling between the first electrical storage device and the input during the sample phase in order to store in the first electrical storage device a first electrical charge representative of the analog input signal, the switching device for eliminating said coupling during the hold phase, the switching device further for causing the first electrical storage device to store a final electrical charge upon completion of the hold phase; and a second electrical storage device coupled to the switching device, the first and second electrical storage devices having respective electrical storage parameters which are equal to one another, the switching device for establishing a coupling between the second electrical storage device and the input during the sample phase in order to store in the second electrical storage device the first electrical charge representative of the analog input signal, the switching device for eliminating said coupling during the hold phase, the switching device for effecting a charging of the second electrical storage device to an inverted electrical charge upon completion of the hold phase, said inverted electrical charge and said final electrical charge mutually inverted relative to a reference electrical charge, said switching device for connecting the second electrical storage device to the first electrical storage device during the sample phase in order to discharge the first electrical storage device.

18. An integrated circuit device, comprising:

an output for providing a desired signal;

circuitry coupled to said output for performing a desired operation to produce said desired signal, including a sample-and-hold apparatus for performing a sample-and-hold operation in each of a series of operational cycles that each include a sample phase followed by a hold phase; and said sample-and-hold apparatus including an input stage having an input for receiving an analog input signal, and having an output, a first electrical storage device coupled to said input and said output of said input stage, a switching device coupled to the first electrical storage device, the switching device for establishing a coupling between the first electrical storage device and the input during the sample phase in order to store in the first electrical storage device a first electrical charge representative of the analog input signal, the switching device for eliminating said coupling during the hold phase, the switching device further for causing the first electrical storage device to store a final electrical charge upon completion of the hold phase, and a second electrical storage device coupled to the switching device, the first and second electrical storage devices having respective electrical storage parameters which are equal to one another, the switching device for establishing a coupling between the second electrical storage device and the input during the sample phase in order to store in the second electrical storage device the first electrical charge representative of the analog input signal, the switching device for eliminating said coupling during the hold phase, the switching device for effecting a charging of the second electrical storage device to an inverted electrical charge, said inverted electrical charge and said final electrical charge mutually inverted relative to a reference electrical charge, said switching device for connecting the second electrical storage device to the first electrical storage device during the sample phase in order to discharge the first electrical storage device.

\* \* \* \* \*